United States Patent [19]
Campagnon

[11] Patent Number: 5,810,611
[45] Date of Patent: Sep. 22, 1998

[54] PICK UP COVER FOR USE IN TRANSPORTING ELECTRICAL HEADERS

[75] Inventor: Jean-Michel Campagnon, Marnay, France

[73] Assignee: Berg Technology, Inc., Reno, Nev.

[21] Appl. No.: 607,970

[22] Filed: Feb. 29, 1996

[51] Int. Cl.⁶ .................................................. H01R 13/44
[52] U.S. Cl. ............................ 439/149; 439/940; 439/41
[58] Field of Search .................................. 439/135, 149, 439/150, 940, 41; 29/739, 837, 879

[56] References Cited

U.S. PATENT DOCUMENTS

| | | | |
|---|---|---|---|
| 5,237,739 | 8/1993 | Clark | 29/747 |
| 5,242,311 | 9/1993 | Seong | 439/135 |
| 5,249,977 | 10/1993 | Tanaka et al. | 439/135 |
| 5,361,492 | 11/1994 | Miyazawa | 29/879 |
| 5,571,022 | 11/1996 | Schaarschmidt | 439/940 |
| 5,613,864 | 3/1997 | Northey | 439/149 |

*Primary Examiner*—Gary F. Paumen
*Assistant Examiner*—Barry M. L. Standig
*Attorney, Agent, or Firm*—Daniel J. Long; M. Richard Page

[57] ABSTRACT

Disclosed is a cover for use in transporting an electrical header which comprises a dielectric housing, terminals mounted on the housing and pins arranged in an array comprising at least two generally parallel longitudinal rows of pins. The cover comprises an upper section including a top surface, an outer and preferably an inner generally concentric wall member extend downwardly in spaced relation from the top section. A concentric groove is formed between said wall members and said wall members and the groove is positioned so that at least one pin in each of said row of pins is engageable in said groove. A recess may also be positioned in the center of the upper surface to increase pick up efficiency. A method for using the cover to manipulate electrical headers is also disclosed.

24 Claims, 4 Drawing Sheets

PICK UP COVER FOR USE IN TRANSPORTING ELECTRICAL HEADERS

BACKGROUND OF THE INVENTION

1. Field of the Invention

The present invention relates to electrical connectors and more particularly to devices used in manipulating and transporting such connectors during the assembly of electrical and electronic products.

2. Brief Description of Prior Developments

Electronic components are often manipulated and transported for positioning on electrical apparatus as, for example, on a printed wiring board by means of vacuum suction nozzles. In the case of electrical headers, vacuum pick up is typically facilitated by means of caps or covers which have a flat upper surface and a lower surface from which projections extend downwardly to engage the pins extending from the housing of the header.

A problem, however, exists with this method of vacuum pick up in that a variety of pin arrays are in common use in electrical headers, and one particular vacuum pick up cover may be well adapted to engage only one or a small number of the variety of arrays in use. A manufacturer will, therefore, often have to keep a variety of vacuum pick up covers in stock if he wishes to be assured of having an appropriate type of vacuum pick up cover for each of the headers with which he may be working.

A need, therefore, exists for a vacuum pick up cover which may be effectively used on a variety of pin arrays.

SUMMARY OF THE INVENTION

The pick up cover of the present invention is used for manipulating components, particularly electrical headers, during the assembly of electrical and electronic devices. This cover has an upper section from which a substantially continuous wall member extends downwardly. This wall member has an open terminal end to allow it to serve as a pin engagement means. At one axial position it is adapted to engage a particular pin array. It may then be pivoted on its vertical axis to a second axial position to allow it to engage a second, different pin array.

In a particular preferred arrangement, the pin engagement means will be comprised of an outer wall and a concentric inner wall which are separated by a concentric groove. In one axial position, pins in a particular array will be engaged by the outer peripheral side of the inner wall. In a second axial position, pins may be engaged by an inner side of the outer wall to allow the same cover to engage a second pin array. In still another preferred arrangement, one of the pin engagement means described above would be combined with an upper section which has an upper surface having a medial recess. This medial recess would serve as a position for disengaging the pick up cover after its manufacture by injection molding.

Also encompassed within the invention is a method for employing a pick up cover for use in transporting electrical headers when the cover comprises an upper section having a central axis and a top surface and inner and outer generally concentric wall members extending downwardly in spaced relation from the upper section such that a concentric groove is formed between said wall members. The header would be comprised of a dielectric housing having pins arranged in an array comprising at least a pair of generally parallel longitudinal rows of pins. This method comprises the steps of pivoting the cap about its central axis by an appropriate angular amount until at least one of the pins in each of the pair of rows in the header array is aligned with the groove formed between the wall members. The cover is then moved to engage said aligned pins with said groove and a force is then exerted on the upper section of the cover to transport the engaged cover and header. In this method the cover would also be engageable with a second header having pins arranged in a different array from said first header and which comprises at least a second pair of longitudinal rows of pins. The cover would be pivoted about its central axis by an appropriate second angular amount until at least one of the pins in each of said second pair of rows is aligned with the groove formed between the wall members. Ordinarily the force applied to the upper section would be a vacuum applied to the smooth top surface of the upper section, but other equivalent means of providing a lifting force on the upper section could also be used.

BRIEF DESCRIPTION OF THE DRAWINGS

The pick up cover of the present invention is further described with reference to the accompanying drawings in which.

DESCRIPTION OF THE PREFERRED EMBODIMENTS

Figure 1:
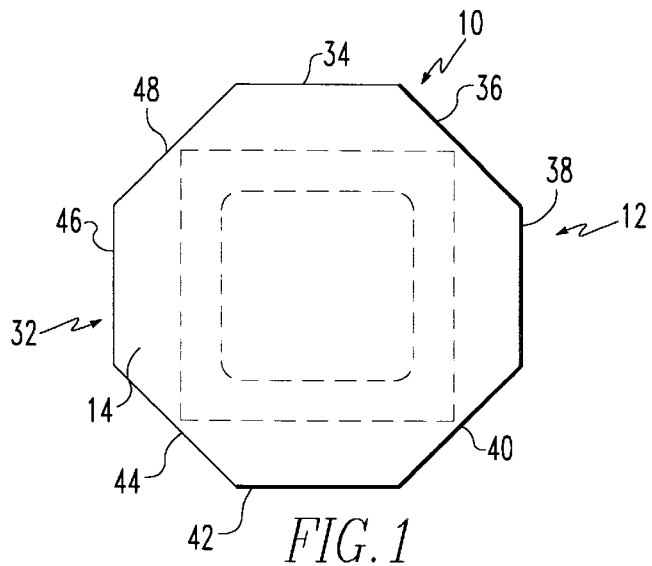
FIG. 1 is a top plan view of a preferred embodiment of the pick up cover of the present invention.
Figure 2:
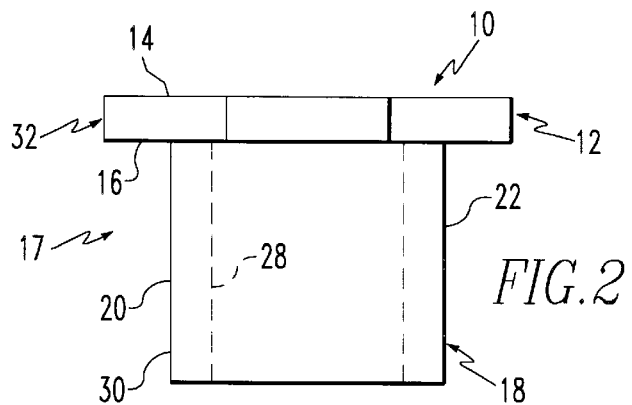
FIG. 2 is a side elevational view of the pick up cover shown in FIG. 1.
Figure 3:
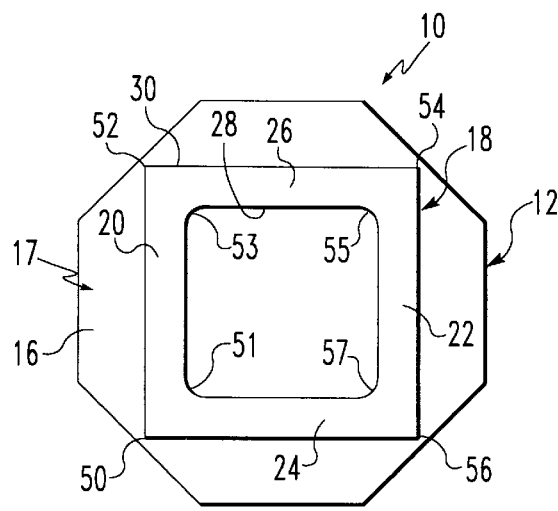
FIG. 3 is a bottom plan view of the pick up cover shown in FIG. 1.

Referring to FIGS. 1–3, the cover is shown generally at numeral 10. The cover includes an upper section 12 which has a smooth top surface 14 and a lower surface 16 from which there projects a pin engagement structure shown generally at numeral 17 in the form of a substantially continuous wall 18. This wall is preferably, though not essentially, rectangular and it has opposed end walls 20 and 22 and opposed side walls 24 and 26. This continuous wall also includes an inner peripheral side 28 and an outer peripheral side 30. The upper section has an octangular peripheral side shown generally at numeral 32 which is made up of sides 34, 36, 38 40, 42, 44, 46 and 48. There are corners 50 and 51; 52 and 53; 54 and 55; and 56 and 57 respectively in the outer and inner peripheral sides of the continuous wall which are adjacent to alternate sides of the octangular peripheral side of the upper section. The operation of this cover will be apparent from the description of second embodiment, but generally a variety of pin arrays may be engaged by means of either the inner peripheral side or the outer peripheral side of the continuous wall.

Figure 4:
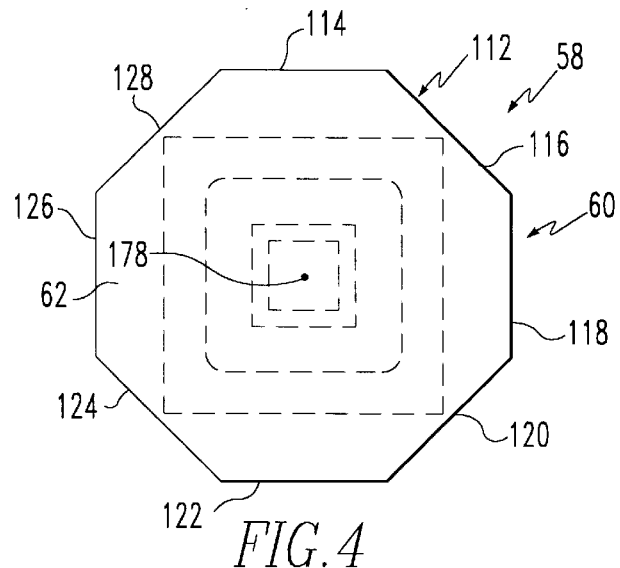
FIG. 4 is a top plan view of a second preferred embodiment of the pick up cover of the present invention.
Figure 5:
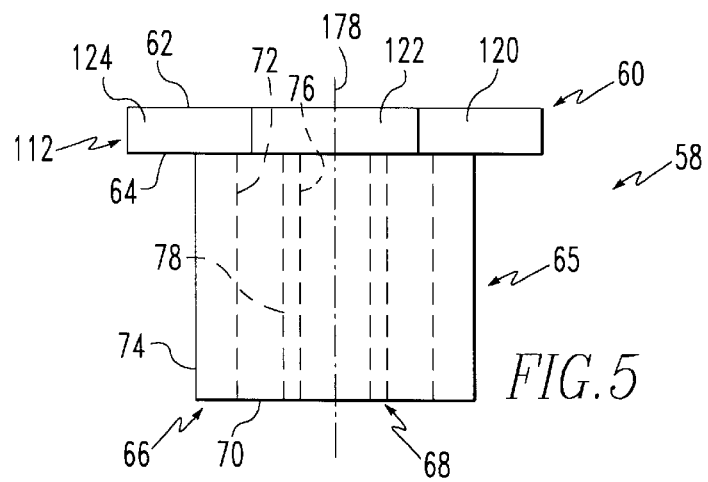
FIG. 5 is a side elevational view of the pick up cover shown in FIG. 4.
Figure 6:
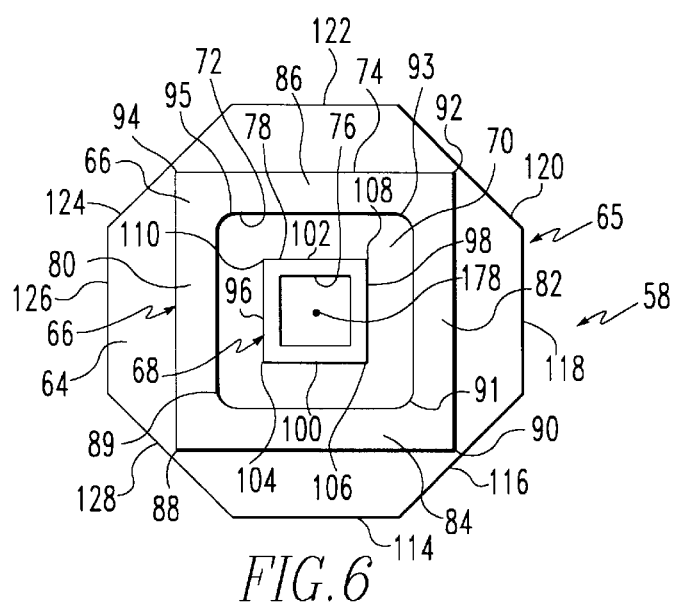
FIG. 6 is a bottom plan view of the pick up cover shown in FIG. 4.

Referring to FIGS. 4–6, a second preferred embodiment of the cover is shown generally at numeral 58. This cover includes an upper section 60 which has a smooth top surface 62 and a lower surface 64 from which a pin engagement structure shown generally at numeral 65 extends. This pin engagement structure is comprised of an outer wall 66 and an inner wall 68 or other medial support means which is concentric with the outer wall. Between the inner and outer wall there is a medial groove 70. The outer wall includes an inner peripheral side 72 and an outer peripheral side 74. Likewise, the inner wall includes an inner peripheral side 76 and an outer peripheral side 78. The outer wall is also preferably, although not essentially, rectangular and it includes opposed end walls 80 and 82 and opposed side walls 84 and 86. The outer wall also has corners 88 and 89; 90 and 91; 92 and 93; and 94 and 95 respectively on its outer and inner peripheral sides. The inner wall also has opposed end walls 96 and 98 and opposed side walls 100 and 102 as well as corners 104, 106, 108 and 110. The upper section 60 has an octangular peripheral edge 112 which is comprised of sides 114, 116, 118, 120, 122, 124, 126 and 128. The corners of the outer wall are positioned so that they are adjacent alternate sides of the octangular peripheral edge of the upper section . Similarly, the corners of the inner peripheral side are lined with the corners of the outer peripheral side and alternate sides of the octangular peripheral edge of the upper section.

Figure 7:
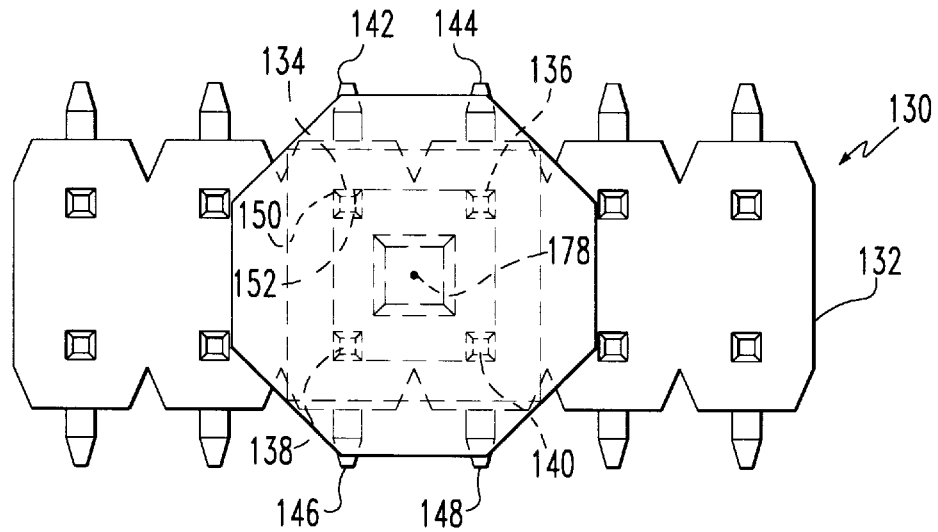
FIG. 7 is a top plan view of the pick up cover shown in FIG. 4 in use with a header having a particular pin array.

Referring to FIG. 7, the cover shown in FIGS. 4–6 is shown in use with a particular header shown generally at numeral 130. This header is comprised of an insulative housing 132 from which pins as at 134, 136, 138 and 140 extend vertically. These pins have, respectively, horizontal extensions 142, 144, 146 and 148. The pins are square and have corners as at 150 and sides as at 152. The cover fits over these pins so that the corners of the pins abut inner corners of the inner peripheral side of the outer wall. Sides of the pins also abut sides of the outer wall.

Figure 8:
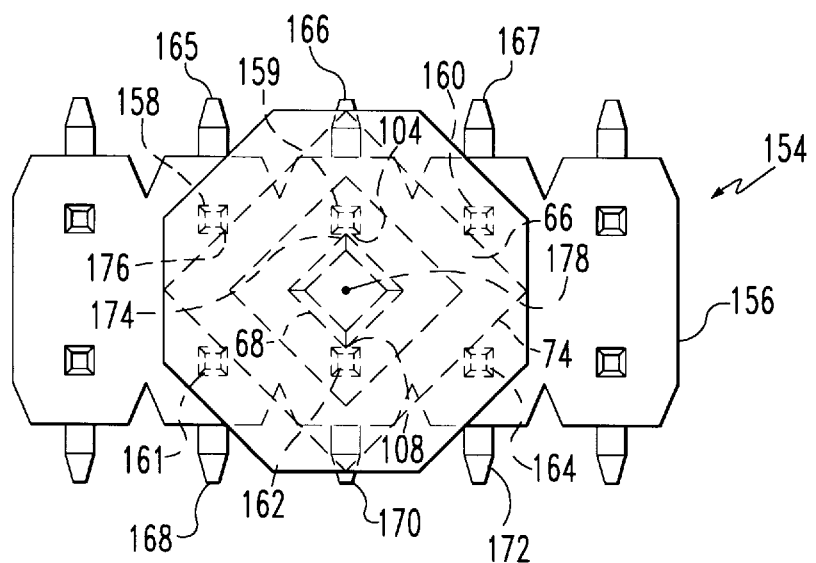
FIG. 8 is a top plan view of the pick up cover shown in FIG. 4 in use with a different header having a different array.

In FIG. 8 the same cover is shown in use on a different header shown generally at numeral 154. This header has an insulated housing 156 and a different pin array with pins as at 158, 159, 160, 161, 162 and 164. These pins have respectively horizontal extensions 165, 166, 167, 168, 170 and 172. The pins are cross sectionally square and have sides as at 174 and corners as at 176. It will be appreciated that the pin array used in header 154 is different from the pin array used in header 130 (FIG. 7). The same cover is able to engage this different pin array by virtue of the fact that the cover is rotated 45 degrees on its vertical axis 178. Thus the corners 104 and 108 of the inner wall abut sides of pins 159 and 162. The outer peripheral side 74 of the outer wall 66 also abuts corners of pins 158, 159, 162 and 164.

Figure 9:
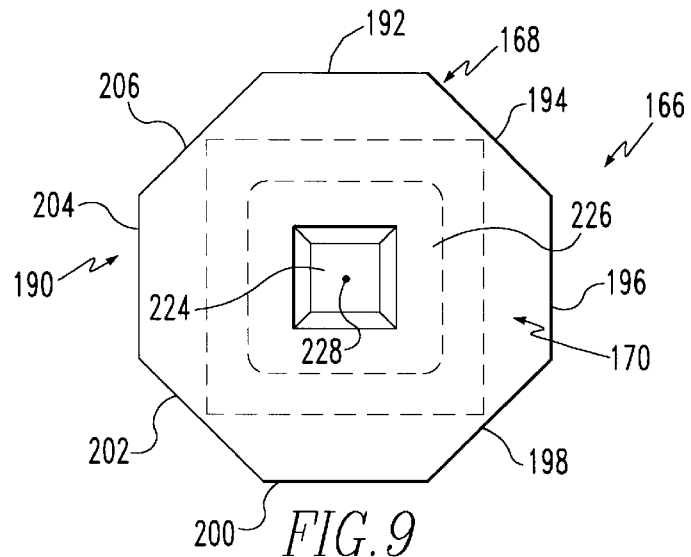
FIG. 9 is a top plan view of a third preferred embodiment of the pick up cover of the present invention.
Figure 10:
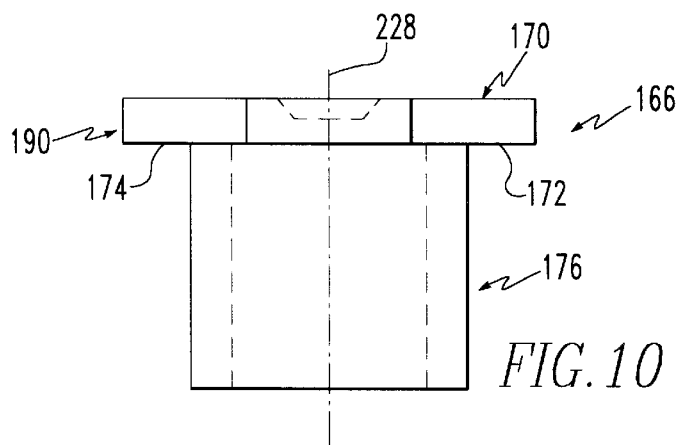
FIG. 10 is a side elevational view of the pick up cover shown in FIG. 9.
Figure 11:
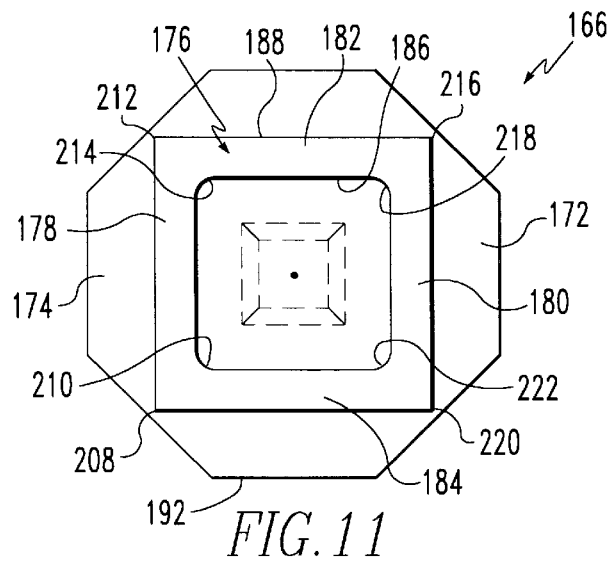
FIG. 11 is a bottom plan view of the pick up cover shown in FIG. 9.

Referring the FIGS. 9–11, the cover is shown generally at numeral 180. The cover includes an upper section 182 which has a top surface 184 and a lower surface 186 from which there projects a pin engagement structure generally at numeral 188 in the form of a substantially continuous wall 190. This wall is preferably, though not essentially, rectangular, and it has opposed end walls 192 and 194 and opposed side walls 196 and 198. This continuous wall also includes an inner peripheral side 200 and an outer peripheral 202. The upper section has an octangular peripheral side shown generally at numeral 204 which is made up of sides 206, 208, 210, 212, 214, 216, 218 and 220. There are corners 222 and 224; 226 and 228; 230 and 232; and 234 and 236 respectively in the outer and inner peripheral sides of the continuous wall which are adjacent to alternate sides of the octangular peripheral side of the upper section. On the top surface of the upper section there is also a recess 238 surrounded by a smooth area 240. The vertical axis 242 of the cover passes through the center of this recess. This recess will be formed in the conventional injection molding procedure. The operation of this cover will be apparent from the description of second embodiment, but generally a variety of pin arrays may be engaged by means of either the inner peripheral side or the outer peripheral side of the continuous wall.

It will be appreciated that a pick up cover has been described which allow the same cover to be used to engage a plurality of different pin arrays by merely pivoting that pick up cover on its vertical axis. By using such a pick up cover, a manufacturer of electrical or electronic devices may efficiently and economically transport and manipulate components being in place on a printed wiring board with only one or a small number of pick up covers rather than with separate pick up covers for each different type of header array.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A cover for use in transporting an electrical header, which header comprises a dielectric housing and pins extending from said housing and said pins being arranged in an array comprising at least two generally parallel longitudinal rows of pins, said cover comprising an upper section including a top surface and inner and outer generally concentric wall members extending axially in spaced concentric relation from the upper section and in opposed relation to said top surface such that a generally concentric groove is formed between said inner and outer wall members and said inner and outer wall members and said concentric groove are positioned so that at least one pin in each of said rows of pins in the header is engageable in said groove.

2. The cover of claim 1 wherein the cover includes a smooth surface for engagement by a vacuum pick up nozzle is transported by vacuum suction.

3. The cover of claim 2 wherein the entire top surface of the cover is smooth.

4. The cover of claim 1 wherein the outer wall has outer and inner peripheral sides which are spaced so that a plurality of pins on the header are engageable by the cover at the inner peripheral side of the outer wall.

5. The cover of claim 4 wherein the outer wall has a plurality of corners and the corners are located so that pins are engaged by at least some of said corners.

6. The cover of claim 5 wherein the outer wall is rectangular and has opposed longitudinal sides and opposed transverse sides.

7. The cover of claim 6 wherein four pins are positioned to be engaged at corners interposed between adjacent sides.

8. The cover of claim 7 wherein the longitudinal sides of the cap are generally parallel to the longitudinal rows of pins.

9. The cover of claim 8 wherein the pins are square pins having corners and are positioned so that one of the pin covers abuts one of the corners of the outer walls.

10. The cover of claim 9 wherein the upper section of the cover is octangular having peripheral sides and the outer peripheral side of the outer wall has corners and said corners are medially adjacent alternate peripheral sides of the octangular upper section.

11. The cover of claim 6 wherein the inner wall is rectangular and has opposed longitudinal sides which are generally parallel to the longitudinal sides of the outer wall.

12. The cover of claim 11 wherein the inner wall has opposed transverse sides which are generally parallel to the transverse sides of the outer wall.

13. The cover of claim 12 wherein the inner wall has outer and inner peripheral sides and the pins on the header are positioned to be engageable by the outer peripheral side of said inner wall.

14. The cover of claim 13 wherein the inner wall has a plurality of corners and pins are engaged by at least some of the corners.

15. The cover of claim 14 wherein two pins are engaged at opposed corners of the inner wall.

16. The cover of claims 15 wherein the longitudinal sides of the inner wall intersect the longitudinal rows of pins by angles of about 45 degrees.

17. The cover of claim 16 wherein a plurality of pins are engaged by the outer peripheral sides of the outer wall.

18. The cover of claim 17 wherein the pins are cross sectionally square and have corners and sides and the corner of the inner peripheral wall abuts sides of the pins.

19. The cover of claim 18 wherein corners of the pins abut the outer peripheral side of the outer wall.

20. The cover of claim 17 wherein the upper section of the cover is octangular having peripheral sides and the outer peripheral side of the outer wall has corners and said corners are medially adjacent alternate peripheral sides of the octangular upper section.

21. A method for employing a pick up cover for use in transporting electrical headers, said cover comprising an upper section having a central axis and a top surface and inner and outer generally concentric wall members extending in spaced relation from the upper section and in opposed relation to said top surface such that a concentric groove is formed between said wall members, and said header comprising a dielectric housing having pins arranged in an array comprising at least a pair of generally parallel longitudinal rows of pins, said method comprising the steps of pivoting the cover about its central axis by a first angular amount until at least one of the pins in each of said pair of rows is aligned with the groove formed between the wall members, then moving said cover to engage said aligned pins with said groove and then exerting a force on the upper section of the cover to transport the engaged cover and header.

22. The method of claim 21 wherein the cover is engageable with a second header having pins arranged in a different array from said first header and comprising at least a second pair of longitudinal rows of pins by pivoting the cap about its central axis by a second angular amount different from said first angular amount until at least one of the pins in each of said second pair of rows is aligned with the groove formed between the wall members.

23. The method of claim 21 wherein the force exerted on the upper section results from a vacuum applied to the top surface.

24. A cover for use in transporting either a first electrical header or a second electrical header, wherein said first electrical header comprises a first dielectric housing and a first plurality of pins extending from said first dielectric housing and said first plurality of pins being arranged in a first array comprising at least two generally parallel longitudinal rows of pins, and wherein said second electrical header comprises a second dielectric housing and a second plurality of pins extending from said second dielectric housing and said second plurality of pins being arranged in a second array different from said first array and comprising at least two generally parallel longitudinal rows of pins, and said cover comprises an upper section including a top surface and inner and outer generally concentric wall members extending axially in spaced concentric relation from the upper section and in opposed relation to said top surface such that a generally concentric groove is formed between said inner and outer wall members and said inner and outer wall members and groove are positioned and said cover has a vertical axis and is pivotable on said vertical axis from a first axial position to a second axial position so that in said first axial position at least one pin in each of said rows of pins in the first electrical header is engageable in said groove and in said second axial position at least one pin in each of said rows of pins in the second electrical header is engageable in said groove.

* * * * *